United States Patent [19]
Yano

[11] Patent Number: 5,804,908
[45] Date of Patent: Sep. 8, 1998

[54] ENHANCEMENT IN BONDING STRENGTH IN FIELD EMISSION ELECTRON SOURCE

[75] Inventor: Akihiro Yano, Tokyo, Japan

[73] Assignee: NEC Corporation, Japan

[21] Appl. No.: 804,400

[22] Filed: Feb. 21, 1997

[30] Foreign Application Priority Data

Feb. 28, 1996 [JP] Japan .................................. 8-041038

[51] Int. Cl.⁶ ...................................................... H01J 1/02
[52] U.S. Cl. ........................ 313/309; 313/336; 313/351; 313/583
[58] Field of Search .................................. 313/309, 336, 313/351, 583

[56] References Cited

FOREIGN PATENT DOCUMENTS 3-250655  11/1991  Japan .............................. H01L 23/50
3-280458  12/1991  Japan .............................. H01L 23/30

*Primary Examiner*—Vip Patel
*Attorney, Agent, or Firm*—Hayes, Soloway, Hennessey, Grossman & Hage, P.C.

[57] ABSTRACT

There is provided a field emission electron source including (a) a substrate at least a surface of which is electrically conductive, (b) at least one conically shaped, electrically conductive emitter, the emitter being formed on the substrate, (c) an electrically insulating layer formed on the substrate for electrically insulating the substrate from a gate electrode, (d) a gate electrode formed on the electrically insulating layer, the gate electrode and the electrically insulating layer being formed with an opening in which the emitter is disposed, (e) a bonding pad formed on the electrically insulating layer and in electrical communication with the gate electrode, (f) a first metal layer formed on the bonding pad, and (g) a second metal layer formed on the first metal layer, the second metal layer having a higher melting point than that of the first metal layer. For instance, the first metal layer is made of Au—Sn alloy, and the second metal layer is made of Au—Si alloy, Au—Ge alloy, Au—K alloy, Al—Si alloy, Au or Al. In accordance with the above mentioned field emission electron source, a bonding pad has a metal surface including Au or Al as a principal component. Hence, even if Al wire or Au wire is used for wire-bonding, there can be obtained sufficiently high bonding strength between a bonding pad and a wire.

10 Claims, 6 Drawing Sheets

ENHANCEMENT IN BONDING STRENGTH IN FIELD EMISSION ELECTRON SOURCE

BACKGROUND OF THE INVENTION

1. Field of the Invention

The invention relates to a field emission electron source and a method of fabricating the same, and more particularly to an improvement in a structure of a bonding pad to be used for wire-bonding.

2. Description of the Related Art

By applying an electric field having an intensity of $1\times10^9$ [v/m] to a surface of metal or semiconductor, electrons pass over a barrier by virtue of the tunnel effect, and thus it is possible to carry out electron emission in vacuum even at room temperature. This phenomenon is called "field electron emission". A cathode emitting electrons under the above mentioned principle is called a "field emission cathode".

These days, it has become possible to fabricate a micron-sized cathode by employing semiconductor integration technique. As an example of such a micro-sized cathode is known a field emission cathode called "Spindt" type cathode. By employing technique for fabricating a micron-sized semiconductor device, it is possible in the "Spindt" type field emission cathode to establish a sub-micron sized gap between a conically shaped emitter and a gate electrode which attracts electrons thereto. Thus, by applying a voltage in two digits across an emitter and a gate electrode, the emitter emits electrons to thereby generate a current ranging from 0.1 μA to 10 μm per an emitter. In addition, since it is possible to fabricate the cathode with a pitch between adjacent emitters being in the range of a few microns to tens of microns, hundreds of thousand emitters can be arranged on a substrate. Hence, it is possible to obtain a high output current, specifically in the range of a few mA to about 100 mA, at a low voltage, and thus the "Spindt" type field emission cathode is now expected to be used as an electron source for a cathode ray tube (CRT), an electron microscope (EM) and a flat panel display.

The above mentioned field emission cathode may be made of electrically conductive silicon (Si), tungsten (W) or tantalum (Ta). However, the cathode is mostly made of molybdenum (Mo), because Mo can be readily processed and has a relatively small work function. FIGS. 1A to 1F are cross-sectional views showing respective step in a method of fabricating the "Spindt" type field emission electron source employing a molybdenum cathode.

First, as illustrated in FIG. 1A, insulating films 52 such as a thermally oxidized film are formed on upper and lower surfaces of a substrate 51 which is either an electrically conductive substrate or an electrically insulating substrate formed at a surface thereof with an electrically conductive layer. Then, a tungsten silicide film 53, which will make a gate electrode, wire and a bonding pad, is formed on one of the insulating films 52.

Then, as illustrated in FIG. 1B, photoresist 54 is applied over the tungsten silicide film 53 and subsequently patterned by employing generally used semiconductor photolithography technique. Then, the photoresist 54 in an area other than an area where a gate electrode, wire and a bonding pad is to be formed is removed by anisotropic dry, reactive ion etching (RIE).

Then, as illustrated in FIG. 1C, photoresist 55 is applied over the tungsten silicide film 53 and patterned by employing semiconductor photolithography technique. Subsequently, the tungsten silicide film 53 and the insulating film 42 are removed in an area where emitters are to be formed, to thereby form gate holes 56. Since a diameter of the gate holes 56 is in the sub-micron order and a space between the adjacent gate holes 56 is small, specifically in the range of a few microns to tens of microns, the formation of the gate holes 56 is carried out by anisotropic dry, reactive ion etching (RIE).

Then, the rest of the photoresist 55 is removed. Then, as illustrated in FIG. 1D, a sacrifice layer 57 made of aluminum or alumina is formed on the tungsten silicide film 53 by evaporation. The reason of the formation of the sacrifice layer 57 is to make it easy to remove unnecessary portions a of molybdenum layer deposited in a later mentioned step. The aluminum or alumina sacrifice layer 57 is formed so that the sacrifice layer 57 is formed on sidewalls of the tungsten silicide film 53 and the insulating layer 52 both of which are exposed to the gate holes 56, but is not formed on an exposed surface 60 of the substrate 51 which surface defines a bottom of the gate holes 56.

Then, as illustrated in FIG. 1E, a molybdenum layer 61 is formed over the sacrifice layer 57 by evaporation to thereby form emitters 62. In evaporation of molybdenum, as molybdenum is gradually evaporated on sidewalls of the gate holes 56, a diameter of the gate holes 56 gradually decreases. Thus, there are formed conically shaped emitters 62 having a sharpened apex.

Then, the substrate 51 is soaked into heated phosphoric acid solution to thereby remove the sacrifice layer 57. The molybdenum layer 61 deposited on the aluminum or alumina sacrifice layer 57 are removed together with the sacrifice layer 57, and hence, as illustrated in FIG. 1F, there are left only the patterned insulating film 52 and tungsten silicide film 53, and the molybdenum emitters 62 on the substrate 51.

FIG. 2 is a perspective view illustrating a conventional field emission electron source fabricated in accordance with the method having been explained with reference to FIGS. 1A to 1F. The illustrated field emission electron source includes a substrate 51 which is either an electrically conductive substrate or an electrically insulating substrate formed at a surface thereof with an electrically conductive layer, one or more emitters 62 made of molybdenum and having a sharpened apex, a gate electrode 75 formed with gate holes 56 surrounding the apexes of the emitters 62, a bonding pad 66 from which a voltage can be applied to the gate electrode 75 through a wire 68 (Not illustrated in FIG. 2. See FIG. 3.), a wire 65 for electrically connecting the gate electrode 75 to the bonding pad 66, and an insulating film 52 formed on the substrate 51. The gate electrode 75, the wire 65 and the bonding pad 66 are formed integrally with one another to thereby constitute a tungsten silicide layer 53. The tungsten silicide layer 53 is electrically insulated from the substrate 51 by the insulating film 52. The above mentioned elements 52, 53, 56 and 62 are all formed on the substrate 51.

FIG. 3 is a cross-sectional view of an example of how the above mentioned conventional field emission electron source is mounted on a package. A package 67 is formed at a surface thereof with an electrically conductive layer 71 on which a field emission electron source is to be mounted. The field emission electron source is fixedly secured to the package 67 on the electrically conductive layer 71 through an adhesive layer 72 made of electrically conductive adhesive or Au—Si eutectic alloy solder. Pins 69 and 74 extend through the package 67 with insulating layers 73 surrounding the pins 69 and 74 to thereby electrically insulate the pins 69 and 74 from the electrically conductive layer 71 of the package 67. The gate electrode 75 and the emitters 62 are wire-bonded to the pins 69 and 74 through electrically conductive wires 68 and 70, so that an external voltage can be applied to the gate electrode 75 and the emitters 62. The bonding pad 66 constitutes a part of the tungsten silicide layer 53, and the wire 68 is directly bonded to the tungsten silicide layer 53. Since the emitters 62 are kept in electrical communication with the electrically conductive layer 71 through the adhesive layer 72, it is possible to apply a voltage to the emitters 62 through both the pin 74 and a lower surface of the field emission electron source at which the field emission electron source is secured to the package 67, by electrically connecting the pin 74 electrically insulated from the package 67 with the electrically conductive layer 71 through the wire 70.

Wire-bonding has been widely used for mounting of a semiconductor element because of its mass production capability. In wire-bonding, bonding strength is an important factor for acquiring reliability for products. In general, when wire-bonded to an aluminum bonding pad formed on a surface of a semiconductor device on which a circuit is to be formed, a wire made of gold or aluminum is bonded to the bonding pad by means of supersonic waves or both supersonic waves and heating.

As explained earlier with reference to FIGS. 1A to 1F, since the conventional method of fabricating a field emission electron source has the step of removing the aluminum or alumina sacrifice layer by soaking into phosphoric acid solution, it is not allowed to make a bonding pad of aluminum. Instead, a bonding pad in the above mentioned conventional field emission electron source is made of tungsten silicide which is resistive to phosphoric acid solution. When wire-bonded to a bonding pad made of tungsten silicide, a wire made of gold is unable to be used because of poor bonding force between tungsten silicide and gold. If a wire made of aluminum is to be used in place of a gold wire, it is impossible to obtain sufficient bonding force between tungsten silicide and aluminum. Specifically, there is merely obtained bonding strength ranging from about 3 grams to 7 grams at maximum.

In the above mentioned conventional field emission electron source, a wire is bonded to a bonding pad made of electrical conductor other than aluminum, such as tungsten silicide. Thus, if a wire made of gold is to be used for wire-bonding, there can be obtained only small bonding force, resulting in that wire-bonding cannot be sufficiently achieved. If a wire made of aluminum is to be used for wire-bonding, sufficient bonding force cannot be obtained, as mentioned earlier. As a result, products can have poor reliability.

Japanese Unexamined Patent Publication No. 3-280458 published on Dec. 11, 1991 has suggested a method of securing an external lead terminal to a metalized metal layer formed on a substrate through solder including Au and In ranging from 0.1 to 15.0 wt % based on Au.

Japanese Unexamined Patent Publication No. 3-250655 published on Nov. 8, 1991 has suggested a method of securing an external lead terminal to a metalized metal layer formed on a substrate through solder including Au, In ranging from 0.1 to 15.0 wt % based on the weight of Au, and at least one of Pd, Rh, Co and Cr ranging from 0.1 to 5.0 wt % based on the weight of Au. Both of Japanese Unexamined Patent Publications Nos. 3-280458 and 3-250655 are hereby incorporated by reference to extent that they are consistent herewith.

However, the methods suggested in those Publications cannot provide sufficient bonding force, if a wire made of gold or aluminum is to be used for wire-bonding.

SUMMARY OF THE INVENTION

It is an object of the present invention to provide a field emission electron source, in which an external voltage is applied to a gate electrode through a wire and a bonding pad, which is capable of providing sufficient bonding force between a wire and a bonding pad, even when a wire made of gold or aluminum is to be used.

In one aspect, there is provided a field emission electron source including (a) a substrate at least a surface of which is electrically conductive, (b) at least one conically shaped, electrically conductive emitter, the emitter being formed on the substrate, (c) an electrically insulating layer formed on the substrate for electrically insulating the substrate from a gate electrode, (d) a gate electrode formed on the electrically insulating layer, the gate electrode and the electrically insulating layer being formed with an opening in which the emitter is disposed, (e) a bonding pad formed on the electrically insulating layer and in electrical communication with the gate electrode, (f) a first metal layer formed on the bonding pad, and (g) a second metal layer formed on the first metal layer, the second metal layer having a higher melting point than that of the first metal layer.

There is further provided a field emission electron source including (a) a substrate at least a surface of which is electrically conductive, (b) at least one conically shaped, electrically conductive emitter, the emitter being formed on the substrate, (c) an electrically insulating layer formed on the substrate for electrically insulating the substrate from a gate electrode, (d) a gate electrode formed on the electrically insulating layer, the gate electrode and the electrically insulating layer being formed with an opening in which the emitter is disposed, (e) a bonding pad formed on the electrically insulating layer and in electrical communication with the gate electrode, (f) a first metal layer formed on the bonding pad, (g) a second metal layer formed on the first metal layer, the second metal layer having a higher melting point than that of the first metal layer, (h) a package, and (i) a third metal layer formed on the package so that the third metal layer is sandwiched between the substrate and the package, the third metal layer having a melting point lower than that of the second metal layer.

The third metal layer may have the same melting point as that of the first metal layer. It is preferable that the third metal layer is made of the same metal as that of the first metal layer.

It is preferable that the second metal layer includes Au or Al as a principal component. In a preferred embodiment, the first metal layer may be made of Au—Sn alloy, and the second metal layer may be made of Au—Si alloy, Au—Ge alloy, Au—K alloy, Al—Si alloy, Au or Al. In another preferred embodiment, the first metal layer may be made of Au—Si alloy or Au—Ge alloy, and the second metal layer may be made of Al—Si alloy, Au or Al.

In another aspect, there is provided a method of fabricating a field emission electron source, including the steps of (a) forming a first metal layer on a bonding pad formed on a substrate, (b) forming a second metal layer on the first metal layer, the second metal layer having a higher melting point than that of the first metal layer, and (c) heating the first metal layer at a temperature higher than a melting point of the first metal layer but lower than a melting point of the second metal layer so that the second metal layer is fixedly secured to the bonding pad through molten first metal layer.

There is further provided a method of fabricating a field emission electron source, including the steps of (a) forming a first metal layer on a bonding pad formed on a substrate, (b) forming a second metal layer on the first metal layer, the second metal layer having a higher melting point than that of the first metal layer, (c) forming a third metal layer on a package, the third metal layer having a melting point lower than that of the second metal layer, (d) laying the substrate on the third metal layer, and (e) heating the first and third metal layers at a temperature higher than melting points of the first and third metal layers but lower than a melting point of the second metal layer so that the second metal layer is fixedly secured to the bonding pad through molten first metal layer and that the substrate is fixedly secured to the package through molten third metal layer.

It is preferable that nitrogen atmosphere is established around the emitters prior to heating the first metal layer.

In accordance with the above mentioned present invention, a bonding pad of the field emission electron source constitutes a metal surface including Au or Al as a principal component. Thus, it is possible to have high bonding force, specifically, 7 grams or greater for an aluminum wire which is generally used for wire-bonding, and 10 grams or greater for a gold wire.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1A:
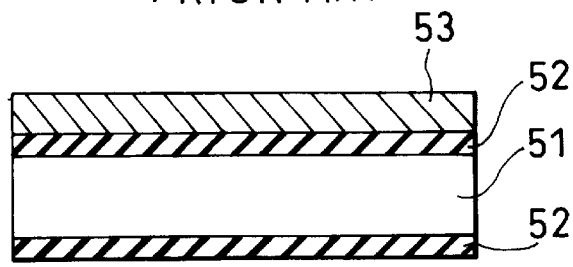
FIGS. 1A to 1F are cross-sectional views illustrating respective steps of a method of fabricating a conventional field emission electron source.
Figure 1B:
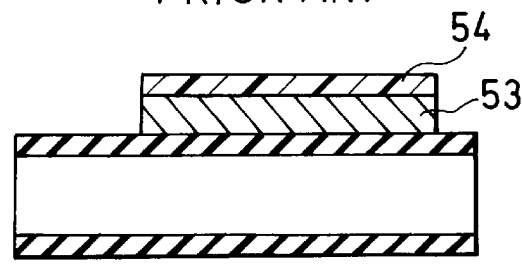
Figure 1C:
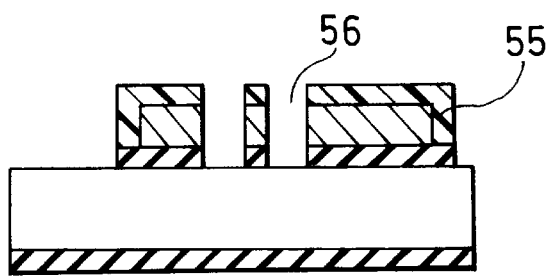
Figure 1D:
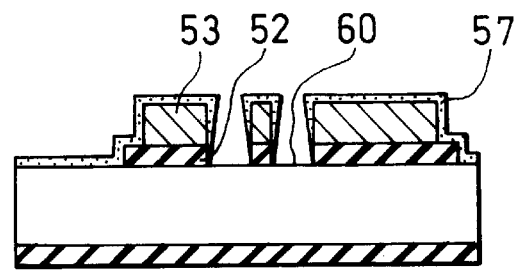
Figure 1E:
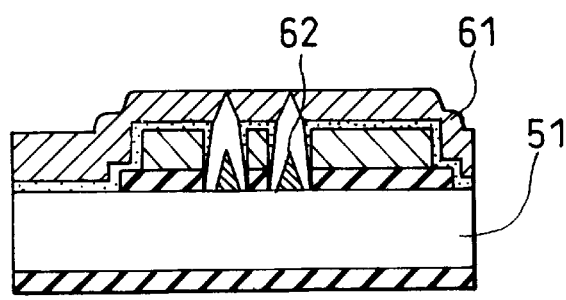
Figure 1F:
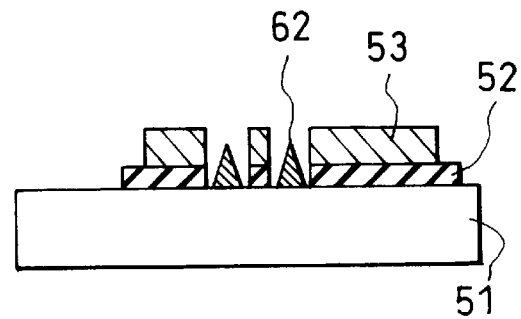
Figure 2:
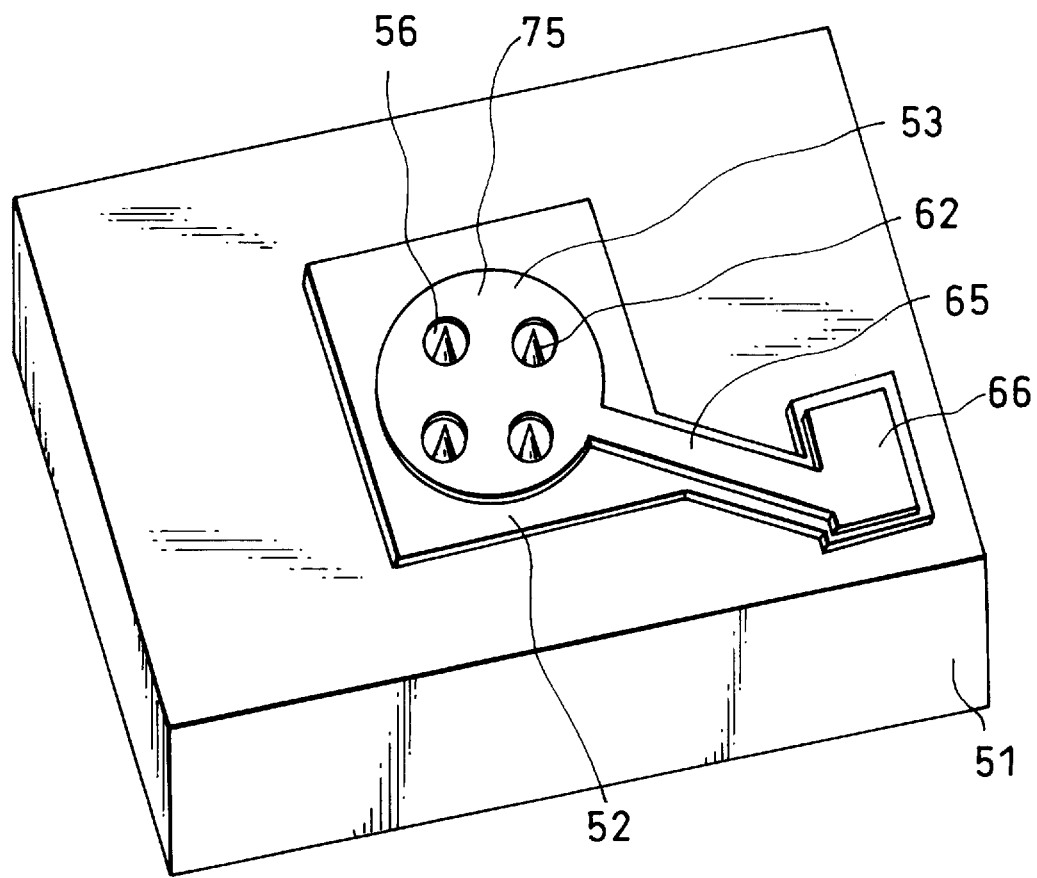
FIG. 2 is a perspective view illustrating a conventional field emission electron source illustrated in FIGS. 1A to 1F.
Figure 3:
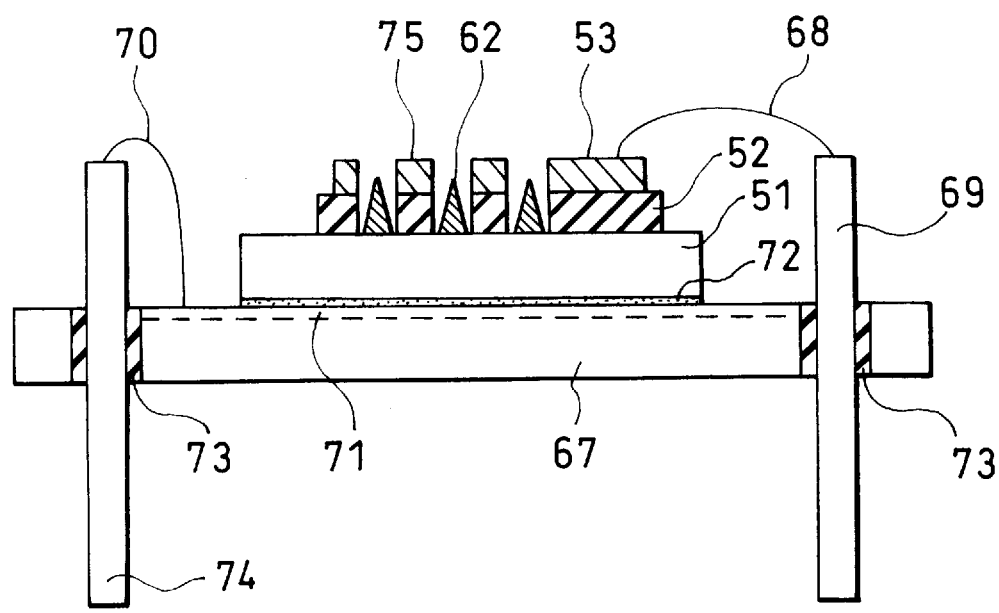
FIG. 3 is a cross-sectional view illustrating a conventional field emission electron source illustrated in FIG. 2, mounted on a package.
Figure 4:
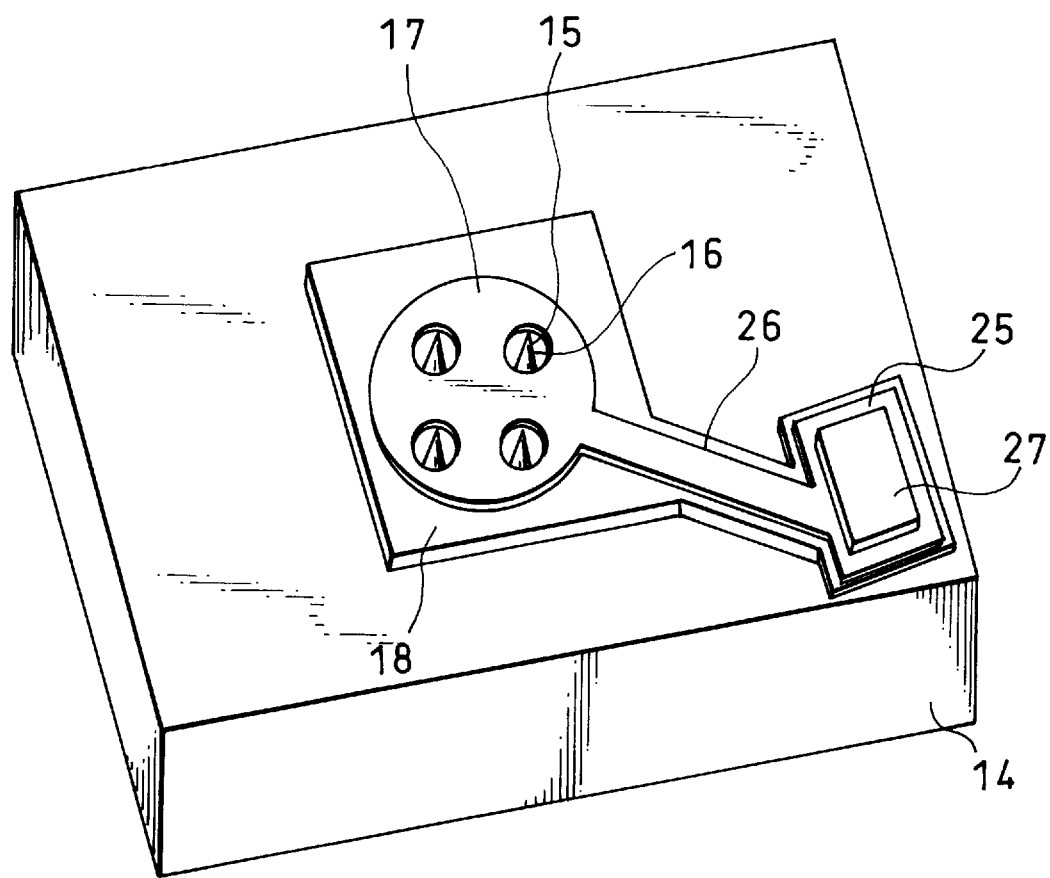
FIG. 4 is a perspective view illustrating a field emission electron source made in accordance with the first embodiment of the present invention.

FIG. 4 illustrates a field emission electron source fabricated in accordance with the first embodiment of the present invention. The field emission electron source includes a substrate 14 which is either an electrically conductive substrate or an electrically insulating substrate formed at a surface thereof with an electrically conductive layer, one or more emitters 15 made of electrical conductor such as molybdenum and having a sharpened apex, a gate electrode 17 formed with gate holes 16 surrounding the apexes of the emitters 15, a wire 26 in electrical connection with the gate electrode 17 for applying a voltage to the gate electrode 17, a bonding pad 25 formed at an end of the wire 26, and an insulating film 18 formed on the substrate 14 for electrically insulating the gate electrode 17 and the substrate 14 from each other. The gate electrode 17, the wire 26 and the bonding pad 25 are formed of electrical conductor such as tungsten silicide integrally with one another. The above mentioned elements 15, 17, 18, 25 and 26 are all formed on the substrate 14.

In addition, there is formed a metal layer 27 (see FIG. 5A) on the bonding pad 25. The metal layer 27 is comprised of a first metal layer 19 (see FIG. 5A) formed on the bonding pad 25 and having a relatively low melting point, and a second metal layer 20 (see FIG. 5A) deposited on the first metal layer and having a melting point higher than the melting point of the first metal layer. In this embodiment, the second metal layer includes Au or Al as a principal component. The first metal layer has been once molten at a temperature higher than the melting point of the first metal layer, but lower than the melting point of the second metal layer, resulting in that the first metal layer is fixedly secured to the bonding pad 25 through the molten first metal layer.

A method of fabricating the field emission electron source illustrated in FIG. 4 is explained hereinbelow with reference to FIGS. 5A and 5B. Since steps of fabricating a field emission electron source except the metal layer 27 are the same as the steps illustrated in FIGS. 1A to 1F, FIGS. 5A and 5B illustrates only the steps of forming the metal layer 27 on the bonding pad 25.

Figure 5A:
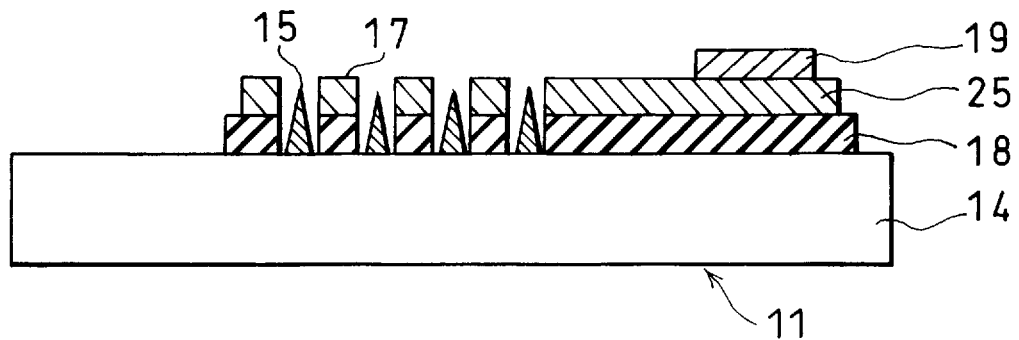
FIGS. 5A and 5B are cross-sectional views illustrating respective steps of a method of fabricating a field emission electron source made in accordance with the present invention.
Figure 5B:
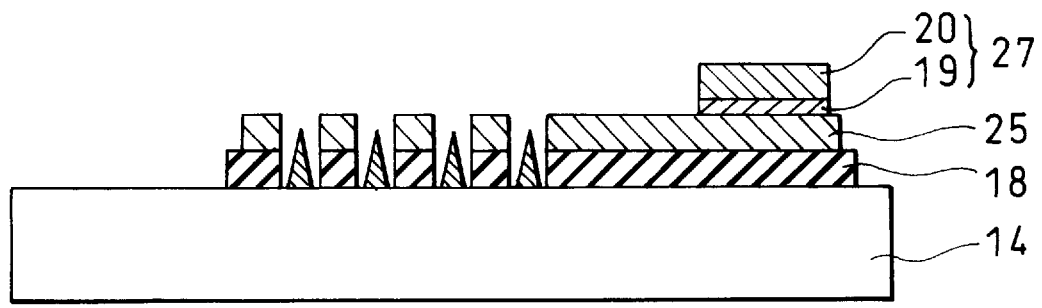

As illustrated in FIG. 5A, a first metal layer 19 having a relatively low melting point is formed on the bonding pad 25 of a field emission electron source 11 fabricated in accordance with the steps illustrated in FIGS. 1A to 1F. In this embodiment, the first metal layer 19 is an Au—Sn alloy layer having a melting point of 280° C. Then, as illustrated in FIG. 5B, a second metal layer 20 having a higher melting point than that of the first metal layer 19 and including Au or Al as a principal component is formed on the first metal layer 19. In this embodiment, the second metal layer 20 is an Au—Ge alloy layer having a melting point of 350° C. In place of the Au—Ge alloy layer, the second metal layer 20 may be an Au—Si alloy layer having a melting point of 360° C., an Au—K alloy layer having a melting point of 340° C., an Au foil layer having a melting point of 1064° C., an Al—Si alloy layer having a melting point of 570° C., or an Al foil layer having a melting point of 660° C.

The field emission electron source 11 is heated at a temperature higher than the melting point of the first metal layer 19 but lower than the melting point of the second metal layer 20 to thereby melt the first metal layer 19. Then, the field emission electron source 11 is cooled down. Thus, the electrical conductor such as tungsten silicide of which the bonding pad 25 is made is fixedly secured to the second metal layer 20 through the molten first metal layer 19. As a result, the bonding pad 25 of the field emission electron source 11 has a surface formed of the metal layer 27 including Au or Al as a principal component.

Figure 6:
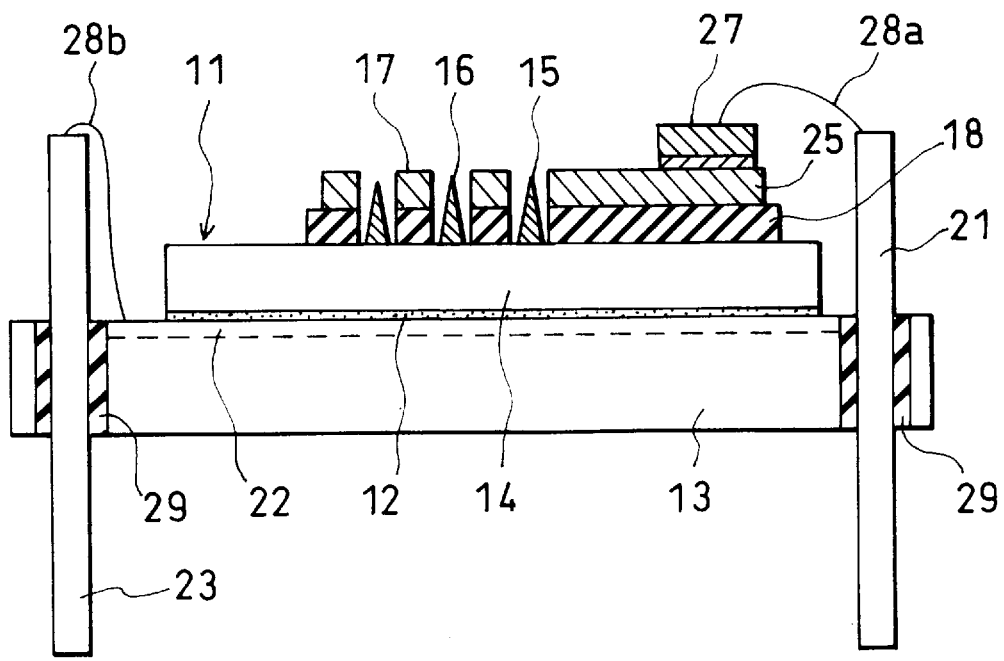
FIG. 6 is a cross-sectional view illustrating a field emission electron source illustrated in FIG. 4, mounted on a package.

FIG. 6 illustrates an example of how the above mentioned field emission electron source 11 is mounted on a package. A package 13 is formed at a surface thereof with an electrically conductive layer 22 on which a field emission electron source is to be mounted. The field emission electron source 11 is fixedly secured to the package 13 on the electrically conductive layer 22 through an adhesive layer 12 made of electrically conductive adhesive or Au—Si eutectic alloy solder. Pins 21 and 23 extend through the package 13 with insulating layers 29 surrounding the pins 21 and 23 to thereby electrically insulate the pins 21 and 23 from the electrically conductive layer 22 of the package 13. The metal layer 27 formed on the bonding pad 25 is wire-bonded to the pin 21 through a wire 28a made of Au or Al, so that an external voltage can be applied to the gate electrode 17 through the pin 21 electrically insulated from the package 13.

Since the emitters 15 are kept in electrical communication with the electrically conductive layer 22 through the electrically conductive adhesive layer 12, it is possible to apply a voltage to the emitters 15 through both the pin 23 and a lower surface of the field emission electron source 11 at which the field emission electron source 11 is secured to the package 13, by electrically connecting the pin 23 electrically insulated from the package 13 with the electrically conductive layer 22 through a wire 28b made of Au or Al similarly to the wire 28a. Thus, it is possible to emit electrons out of apexes of the emitters 15 by applying a voltage across the pins 21 and 23.

As explained so far, in accordance with the above mentioned embodiment, since the metal layer 27 including Au or Al as a principal component is formed on the bonding pad 25, it is possible to have sufficient bonding force between the wire 28a and the bonding pad 25, even if the wire 28a is made of Au or Al.

Figure 7:
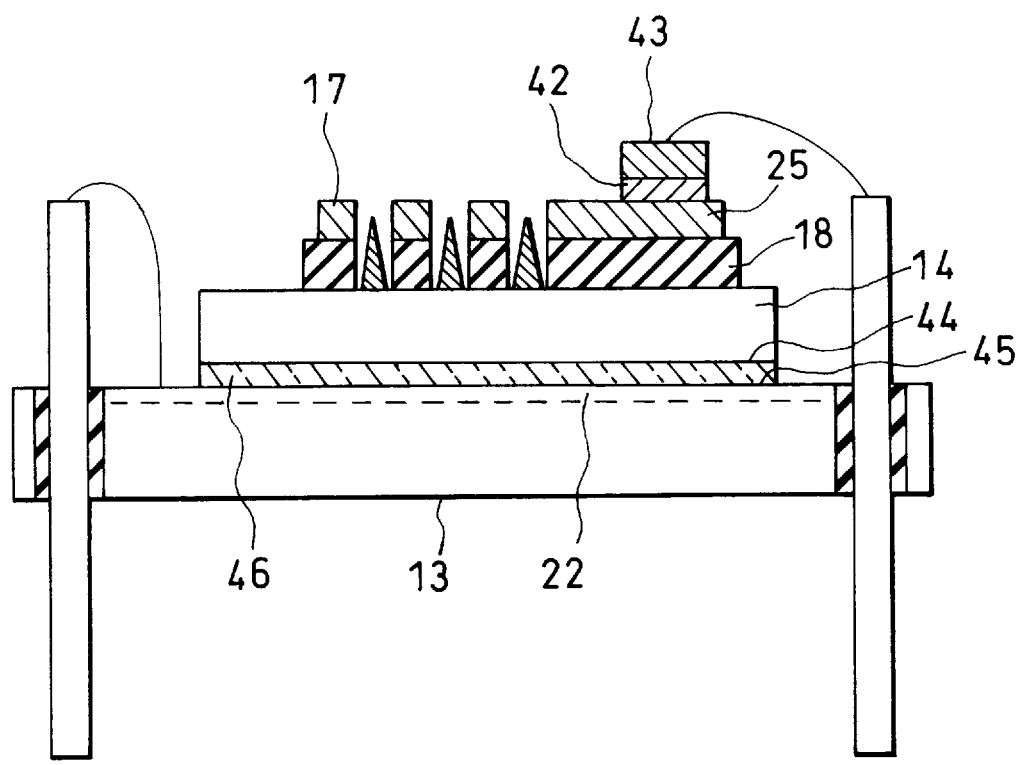
FIG. 7 is a cross-sectional view illustrating a field emission electron source illustrated in FIG. 4, mounted on a package in another way.

FIG. 7 illustrates that the field emission electron source 11 made in accordance with the second embodiment is mounted on a package. The second embodiment is different from the first embodiment in that the first and second metal layers are made of different metals from those of the first embodiment, and that there is provided a third metal layer 46 sandwiched between the substrate 14 and the package 13 for fixedly securing the substrate 14 to the package 13.

A first metal layer 42 is formed on the bonding pad 25 made of electrical conductor such as tungsten silicide. The first metal layer 42 is made of Au—Si alloy which has a melting point of 360° C. On the first metal layer 42 is formed a second metal layer 43 including Au or Al as a principal component and having a higher melting point than the melting point of the first metal layer 42. In this embodiment, the second metal layer 43 is made of Al—Si alloy which has a melting point of 570° C. The first metal layer 42 may be made of Au—Ge alloy having a melting point of 350° C. in place of Au—Si alloy. Similarly, the second metal layer 43 may be made of gold foil having a melting point of 1064° C. or aluminum foil having a melting point of 660° C.

In the second embodiment, a third metal layer 46 is sandwiched between a mount surface or a lower surface of the field emission electron source 11 and a chip mounting surface 45 of the package 13. The third metal layer 46 is made of the same metal as the first metal layer 42, that is, Au—Si alloy having a melting point of 360° C.

By heating the field emission electron source 11 together with the first to third metal layers 42, 43 and 46 at a temperature higher than the melting point (360° C.) of the first and third metal layers 42 and 46, but lower than the melting point (570° C.) of the second metal layer 43, it is possible to simultaneously melt the first and third metal layers 42 and 46, ensuring not only that the second metal layer 43 is fixedly secured to the bonding pad 25 through the molten first metal layer 42, but also that the field emission electron source 1 is fixedly secured to the package 13 through the molten third metal layer 46. Thus, it is no longer necessary to carry out heating twice or more. Since heating causes molybdenum to oxidize, carrying out heating smaller times would be advantageous for the emitters 15 made of molybdenum. The second embodiment provides an advantage that heating treatment is carried out only once.

In the above mentioned embodiment, the third metal layer 46 is made of the same metal as that of the first metal layer 42. However, it should be noted that the third metal layer 46 may be made of different metal from that of the first metal layer 42 unless the metal has a lower melting point than the melting point of the second metal layer 43.

As explained so far, in accordance with the above mentioned first and second embodiments, a bonding pad of a field emission electron source is made of a metal layer including Au or Al as a principal component in place of electrical conductor such as tungsten silicide of which a conventional bonding pad is made, and a wire made of Al or Au is wire-bonded to the bonding pad. As a result, it is possible to sufficient bonding force, specifically, 7 grams or greater when an aluminum wire is used, and 10 grams or greater when a gold wire is used.

When the first metal layer 19 or 42 is to be molten, the field emission electron source 11 is heated at a temperature of 280° C. for the Au—Si alloy first metal layer 19 or 360° C. for the Au—Si alloy first metal layer 42, as mentioned earlier. Since those temperatures 280° C. and 360° C. are lower than 600° C. at which diffusion occurs between molybdenum and a silicon substrate, it is possible to avoid a problem that shapes of the emitters are irregularly deformed by diffusion. In addition, it is also possible to avoid a surface of electrical conductors such as molybdenum from being oxidized by establishing nitrogen atmosphere around the emitters before the first metal layer is molten.

It should be noted that the present invention can be applied when the gate electrode 17 and the bonding pad 25 are made of molybdenum, tungsten or polysilicon other than tungsten silicide.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-41038 filed on Feb. 28, 1996 including specification, claims, drawings and summary is incorporated herein by reference in its entirety.

What is claimed is:

1. A field emission electron source comprising:
   (a) a substrate at least a surface of which is electrically conductive;
   (b) at least one conically shaped, electrically conductive emitter, said emitter being formed on said substrate;
   (c) an electrically insulating layer formed on said substrate for electrically insulating said substrate from a gate electrode;
   (d) said gate electrode formed on said electrically insulating layer, said gate electrode and said electrically insulating layer being formed with an opening in which said emitter is disposed;
   (e) a bonding pad formed on said electrically insulating layer and in electrical communication with said gate electrode;
   (f) a first metal layer formed on said bonding pad; and
   (g) a second metal layer formed on said first metal layer, said second metal layer having a higher melting point than that of said first metal layer.

2. The field emission electron source as set forth in claim 1, wherein said second metal layer includes one of Au and Al as a principal component.

3. The field emission electron source as set forth in claim 1, wherein said first metal layer is made of Au—Sn alloy, and said second metal layer is made of a metal selected from a group consisting of Au—Si alloy, Au—Ge alloy, Au—K alloy, Al—Si alloy, Au and Al.

4. The field emission electron source as set forth in claim 1, wherein said first metal layer is made of a metal selected from a group consisting of Au—Si alloy and Au—Ge alloy, and said second metal layer is made of a metal selected from a group consisting of Al—Si alloy, Au and Al.

5. A field emission electron source comprising:
   (a) a substrate at least a surface of which is electrically conductive;
   (b) at least one conically shaped, electrically conductive emitter, said emitter being formed on said substrate;
   (c) an electrically insulating layer formed on said substrate for electrically insulating said substrate from a gate electrode;
   (d) said gate electrode formed on said electrically insulating layer, said gate electrode and said electrically insulating layer being formed with an opening in which said emitter is disposed;
   (e) a bonding pad formed on said electrically insulating layer and in electrical communication with said gate electrode;
   (f) a first metal layer formed on said bonding pad;
   (g) a second metal layer formed on said first metal layer, said second metal layer having a higher melting point than that of said first metal layer;
   (h) a package; and
   (i) a third metal layer formed on said package so that said third metal layer is sandwiched between said substrate and said package, said third metal layer having a melting point lower than that of said second metal layer.

6. The field emission electron source as set forth in claim 5, wherein said third metal layer has the same melting point as that of said first metal layer.

7. The field emission electron source as set forth in claim 5, wherein said third metal layer is made of the same metal as that of said first metal layer.

8. The field emission electron source as set forth in claim 5, wherein said second metal layer includes one of Au and Al as a principal component.

9. The field emission electron source as set forth in claim 5, wherein said first metal layer is made of Au—Sn alloy, and said second metal layer is made of a metal selected from a group consisting of Au—Si alloy, Au—Ge alloy, Au—K alloy, Al—Si alloy, Au and Al.

10. The field emission electron source as set forth in claim 5, wherein said first metal layer is made of a metal selected from a group consisting of Au—Si alloy and Au—Ge alloy, and said second metal layer is made of a metal selected from a group consisting of Al—Si alloy, Au and Al.

* * * * *